(12) United States Patent
Rossi et al.

(10) Patent No.: US 9,323,268 B2
(45) Date of Patent: *Apr. 26, 2016

(54) LOW VOLTAGE ISOLATION SWITCH, IN PARTICULAR FOR A TRANSMISSION CHANNEL FOR ULTRASOUND APPLICATIONS

(75) Inventors: Sandro Rossi, Pavia (IT); Antonio Ricciardo, Vigevano (IT); Davide Ugo Ghisu, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 490 days.

This patent is subject to a terminal disclaimer.

(21) Appl. No.: 13/538,598

(22) Filed: Jun. 29, 2012

(65) Prior Publication Data

US 2012/0268189 A1   Oct. 25, 2012

Related U.S. Application Data

(63) Continuation-in-part of application No. PCT/EP2010/005931, filed on Sep. 29, 2010, and a continuation-in-part of application No. PCT/EP2010/005932, filed on Sep. 29, 2010, and a (Continued)

(30) Foreign Application Priority Data

| Dec. 30, 2009 | (IT) | MI2009A2338 |
| Dec. 30, 2009 | (IT) | MI2009A2339 |
| Dec. 30, 2009 | (IT) | MI2009A2340 |
| Dec. 30, 2009 | (IT) | MI2009A2341 |

(51) Int. Cl.
*H03K 17/56* (2006.01)
*H03K 17/16* (2006.01)

(Continued)

(52) U.S. Cl.
CPC .......... *G05F 3/02* (2013.01); *H03K 19/018521* (2013.01); *H03K 19/09443* (2013.01)

(58) Field of Classification Search
CPC ................ H03K 19/018521; H03K 19/09443; G05F 3/02
USPC .......................... 327/382, 390, 427, 434, 436
See application file for complete search history.

(56) References Cited

U.S. PATENT DOCUMENTS

| 3,958,127 A | 5/1976 | Faulhaber et al. |
| 5,414,378 A | 5/1995 | Edgar et al. |

(Continued)

FOREIGN PATENT DOCUMENTS

WO   2005/078931 A1   8/2005

*Primary Examiner* — Lincoln Donovan
*Assistant Examiner* — Colleen O Toole
(74) *Attorney, Agent, or Firm* — Seed IP Law Group PLLC

(57) ABSTRACT

A switching circuit is electrically coupled between a connection terminal and an output terminal of a transmission channel and includes first and second switching transistors electrically coupled in series to each other and having respective body diodes in anti-series, between the connection terminal and the output terminal. The switching circuit comprises a bootstrap circuit connected to respective first and second control terminals of these first and one second switching transistors, as well as to respective first and second voltage references. The bootstrap circuit includes a first parasitic capacitance electrically coupled between the first control terminal and a first bootstrap node, and a second parasitic capacitance electrically coupled between the second control terminal and a second bootstrap node. The parasitic capacitances have value of at least one order of magnitude lower with respect to the gate-source capacitances of the first and second switching transistors.

21 Claims, 4 Drawing Sheets

Related U.S. Application Data continuation-in-part of application No. PCT/EP2010/005927, filed on Sep. 29, 2010, and a continuation-in-part of application No. PCT/EP2010/005930, filed on Sep. 29, 2010.

(51) Int. Cl.
  *H03K 17/30* (2006.01)
  *G05F 3/02* (2006.01)
  *H03K 19/0185* (2006.01)
  *H03K 19/0944* (2006.01)

(56) References Cited

U.S. PATENT DOCUMENTS

| | | |
|---|---|---|
| 5,475,342 A | 12/1995 | Nakamura et al. |
| 6,050,945 A | 4/2000 | Peterson et al. |
| 6,269,052 B1 | 7/2001 | Oppelt |
| 6,540,677 B1 | 4/2003 | Angelsen et al. |
| 7,324,167 B2 | 1/2008 | Miller |
| 7,432,737 B2 | 10/2008 | Yoshida |
| 7,521,984 B2 * | 4/2009 | Ricotti .................. 327/427 |
| 7,760,272 B2 | 7/2010 | Miller |
| 7,888,985 B2 | 2/2011 | Osaka |
| 8,159,267 B2 | 4/2012 | Yoshida |
| 2002/0070805 A1 | 6/2002 | Ausserlechner et al. |
| 2004/0227556 A1 | 11/2004 | Ohmori |
| 2005/0139931 A1 | 6/2005 | Arai |
| 2008/0116751 A1 | 5/2008 | Kihara et al. |
| 2009/0206676 A1 | 8/2009 | Chu et al. |
| 2010/0067915 A1 | 3/2010 | Fukasaku et al. |
| 2011/0115540 A1 | 5/2011 | Kamp |
| 2012/0268092 A1 | 10/2012 | Rossi et al. |
| 2012/0268186 A1 | 10/2012 | Rossi et al. |
| 2012/0268189 A1 | 10/2012 | Rossi et al. |
| 2012/0268200 A1 | 10/2012 | Rossi et al. |

* cited by examiner

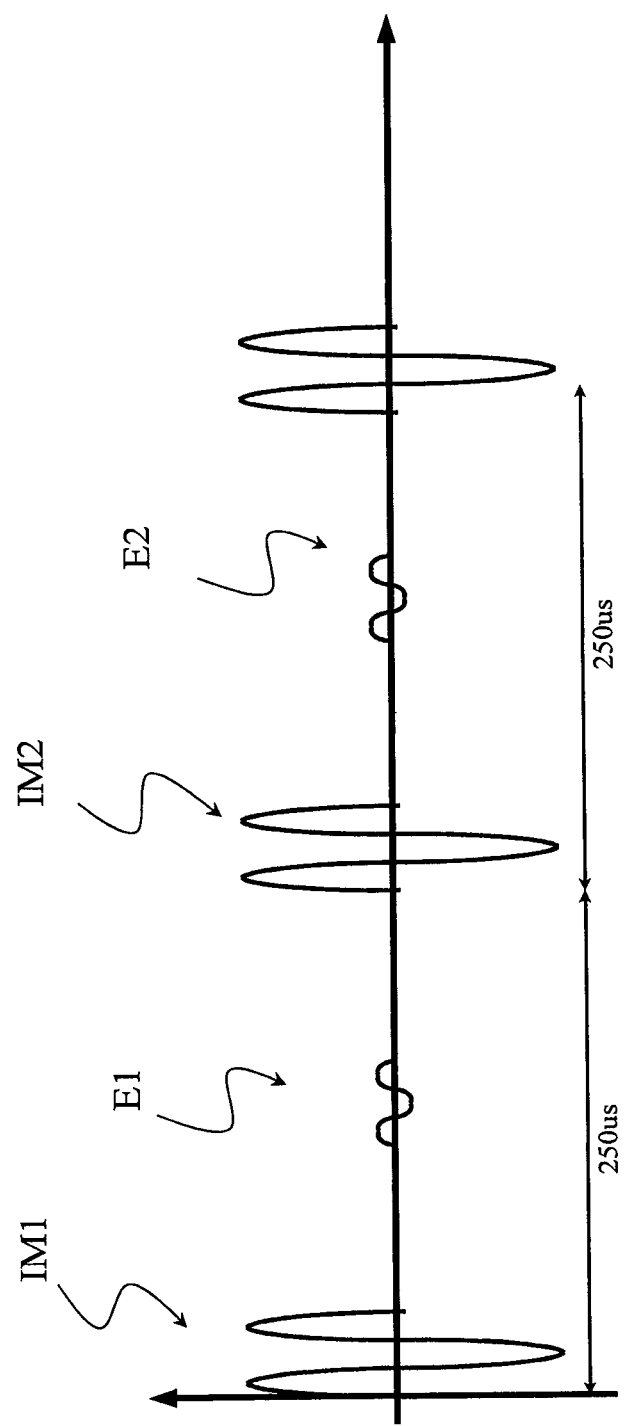

ial Field

The present disclosure relates to a switching circuit. More specifically the disclosure relates to a switching circuit electrically coupled between a connection terminal and an output terminal of a transmission channel and comprising at least one first and one second switching transistor electrically coupled in series to each other between the connection terminal and the output terminal. The disclosure also relates to a transmission channel comprising at least such a switching circuit. The disclosure particularly, but not exclusively, relates to a switching circuit configured to switch between a receiving mode and a transmission mode and suitable for being used by a transmission channel for ultrasound applications and the following description is made with reference to this field of application by way of illustration only.

2. Description of the Related Art

As is well known, sonography or ultrasonography is a system of medical diagnostic testing that uses ultrasonic waves or ultrasounds and is based on the principle of the transmission of the ultrasounds and of the emission of echo and is widely used in the internistic, surgical and radiological field.

The ultrasounds being normally used are comprised between 2 and 20 MHz. The frequency is chosen by taking into consideration that higher frequencies have a greater image resolving power, but penetrate less in depth in the subject under examination.

These ultrasounds are normally generated by a piezoceramic crystal inserted in a probe being maintained in direct contact with the skin of the subject with the interposition of a suitable gel (being suitable for eliminating the air between probe and subject's skin, allowing the ultrasounds to penetrate in the anatomic segment under examination). The same probe is able to collect a return signal or echo, which is suitably processed by a computer and displayed on a monitor.

In particular, the ultrasounds that reach a variation point of the acoustic impedance, and thus for example an internal organ, are partially reflected and the reflected percentage conveys information about the impedance difference between the crossed tissues. It is to be noted that, the big impedance difference between a bone and a tissue being considered, with the sonography it is not possible to see behind a bone, which causes a total reflection of the ultrasounds, while air or gas zones give "shade", causing a partial reflection of the ultrasounds.

The time employed by an ultrasonic wave for carrying out the path of transmission, reflection and return is provided to the computer, which calculates the depth wherefrom the echo has come, thus identifying the division surface between the tissues crossed (corresponding to the variation point of the acoustic impedance and thus to the depth wherefrom the echo comes).

Substantially, an ultrasonographer, in particular a diagnostic apparatus based on the ultrasound sonography, typically comprises three parts:

a probe comprising at least one transducer, in particular of the ultrasonic type, which transmits and receives an ultrasound signal;
an electronic system that drives the transducer for the generation of the ultrasound signal or pulse to be transmitted and receives an echo signal of return at the probe of this pulse, processing in consequence the received echo signal; and
a displaying system of a corresponding sonography image processed starting from the echo signal received by the probe.

In particular, the word transducer generally indicates an electric or electronic device that converts a type of energy relative to mechanical and physical quantities into electric signals. In a broad sense, a transducer is sometimes defined as any device that converts energy from one form to another, so that this latter can be re-processed either by men or by other machines. Many transducers are both sensors and actuators. An ultrasonic transducer usually comprises a piezoelectric crystal that is suitably biased for causing its deformation and the generation of the ultrasound signal or pulse.

A typical transmission channel or TX channel being used in these applications is schematically shown in FIG. 1, globally indicated with 1.

In particular, the transmission channel 1 comprises an input logic block 2 that drives, in correspondence with an input bus $BUS_{IN}$, a level shifter 3, in turn connected to a high voltage buffer block 4. The high voltage buffer block 4 is electrically coupled between pairs of high voltage reference terminals, respectively higher HVP0 and HVP1 and lower HVM0 and HVM1, and has a pair of input terminals, INB1 and INB2, connected to the level shifter 3, as well as a pair of output terminals, OUTB1 and OUTB2, connected to a corresponding pair of input terminals, INC1 and INC2 of a clamping block 5.

Furthermore, the clamping block 5 is connected to a clamp voltage reference terminal PGND and has an output terminal corresponding to a first output terminal HVout of the transmission channel 1, in turn connected, through an antinoise block 6, to a connection terminal Xdcr for the transducer to be driven through the transmission channel 1.

Finally, a high voltage switch 7 is electrically coupled between the connection terminal Xdcr and a second output terminal LVout of the transmission channel 1. This high voltage switch 7 is able to transmit an output signal at the output of the antinoise block 6 to the output terminal LVout during the receiving step of the transmission channel 1.

More in detail, the high voltage buffer block 4 comprises a first branch comprising a first buffer transistor MB1 and a first buffer diode DB1 electrically coupled in series to each other between the first higher voltage reference terminal HVP0 and a buffer central node XBc, as well as a second buffer diode DB2 and a second buffer transistor MB2 electrically coupled in series to each other between the buffer central node XBc and the first lower voltage reference terminal HVM0. The first and second buffer transistors, MB1 and MB2, have respective control or gate terminals in correspondence with a first XB1 and a second inner circuit node XB2, respectively, of the high voltage buffer block 4 and connected to, and driven by, first and second buffer input drivers DRB1, DRB2, respectively, in turn connected to the level shifter 3 in correspondence with the first and the second input terminals, INB1 and INB2, of the high voltage buffer block 4.

The high voltage buffer block 4 also comprises a second branch in turn comprising a third buffer transistor MB3 and a third buffer diode DB3 electrically coupled in series to each other between the second higher voltage reference terminal HVP1 and the buffer central node XBc, as well as a fourth buffer diode DB4 and a fourth buffer transistor MB4 electrically coupled in series to each other between the buffer central node XBc and the second lower voltage reference terminal HVM1. The third and fourth buffer transistors, MB3 and MB4, have respective control or gate terminals in correspondence with a third XB3 and a fourth inner circuit node XB4, respectively, of the high voltage buffer block 4 and connected to, and driven by, a third DRB3 and a fourth buffer input driver DRB4, in turn connected to the first XB1 and to the second inner circuit node XB2 and then to the first DRB1 and to the second buffer input driver DRB2, respectively, as well as to a first OUTB1 and to a second output terminal OUTB2.

In particular, in the example of the figure, the first and third buffer transistors, MB1 and MB3, are high voltage P-channel MOS transistors (HV PMOS) while the second and fourth buffer transistors, MB2 and MB4, are high voltage N-channel MOS transistors (HV NMOS). Moreover, the buffer diodes, DB1, DB2, DB3 and DB4, are high voltage diodes (HV diode).

The clamping block 5 has in turn a first INC1 and a second input terminal INC2, respectively connected to the first OUTB1 and second OUTB2 output terminals of the high voltage buffer block 4.

In particular, the clamping block 5 comprises a first clamp driver DRC1 connected between the first input terminal INC1 and a control or gate terminal of a first clamp transistor MC1, in turn electrically coupled in series with a first clamp diode DC1 between the clamp voltage reference PGND, in particular a ground, and a clamp central node XCc. The first clamp transistor MC1 and the first clamp diode DC1 are interconnected in correspondence with a first clamp circuit node XC1.

The clamping block 5 also comprises a second clamp driver DRC2 connected between the second input terminal INC2 and a control or gate terminal of a second clamp transistor MC2, in turn electrically coupled in series with a second clamp diode DC2 between the clamp central node XCc and the clamp voltage reference PGND. The second clamp transistor MC2 and the second clamp diode DC2 are interconnected in correspondence with a second clamp circuit node XC2.

The clamp central node XCc is also connected to the first output terminal HVout of the transmission channel 1, in turn connected to the connection terminal Xdcr through the antinoise block 6 comprising respective first and second antinoise diodes, DN1 and DN2, connected in antiparallel, i.e., by having the anode terminal of the first diode connected to the cathode terminal of the second one and vice versa, between the first output terminal HVout and connection terminal Xdcr.

In particular, in the example of the figure, the first clamp transistor MC1 is a high voltage P-channel MOS transistor (HV PMOS) while the second clamp transistor MC2 is a high voltage N-channel MOS transistor (HV NMOS). Moreover, the clamp diodes, DC1 and DC2, are high voltage diodes (HV diode) while the antinoise diodes, DN1 and DN2, are low voltage diodes (LV diode).

The high voltage switch 7 is shown in greater detail in FIG. 2A, while its equivalent circuit according to working conditions (ON) is shown in FIG. 2B.

In particular, the high voltage switch 7 comprises a first MS1 and a second switch transistor MS2 electrically coupled in series to each other between the connection terminal Xdcr and the second output terminal LVout of the transmission channel 1 and having respective control or gate terminals connected to first and second supply voltage reference terminals VDD_M and VDD_P, respectively. FIG. 2A also shows the equivalent diodes, DS1 and DS2, of the switching transistors, MS1 and MS2, as well as their gate-source capacitances, Cg1 and Cg2 respectively.

In particular, the first capacitance Cg1 of the first switching transistor MS1 is connected between the corresponding gate terminal, in turn connected to the first supply voltage reference VDD_M and a first switching node XS1, corresponding to a source terminal of the first switching transistor MS1. Similarly, the second capacitance Cg2 of the second switching transistor MS2 is connected between the corresponding gate terminal, in turn connected to the second supply voltage reference VDD_P and a second switching node XS2, corresponding to a source terminal of the second switching transistor MS2.

As shown in the equivalent circuit of FIG. 2B, when the high voltage switch 7 is on and thus the gate terminals of the switching transistors MS1 and MS2 are connected to the first VDD_M and to the second supply voltage reference VDD_P as indicated in the FIG. 2A (that in FIG. 2B, for sake of simplicity, have been shown as a single reference voltage, in particular the ground, being these first and second supply voltage references fix supplies), these switching transistors behave as respective resistances R1 and R2, which are inserted between the connection terminal Xdcr and the second output terminal LVout of the transmission channel 1 (the second output terminal Lvout coinciding with the second switching node XS2) and interconnected in correspondence with the first switching node XS1.

According to these conditions, the first capacitance Cg1 is connected between the first connection node XS1 and the first supply voltage reference VDD_M, while the second capacitance Cg2 is connected between the second connection node XS2 and the second supply voltage reference VDD_P. The first and second supply voltage references are fixed supplies, and are shown for sake of simplicity in FIG. 2B as a single reference voltage, in particular the ground GND. This parallel capacitance introduces unwillingly a strong mitigation of the signal at the input of the high voltage switch 7, i.e., of the signal at the output from the transmission channel 1 after the antinoise block 6.

It is to be noted that the switch 7 is a high voltage one since, during the transmission step of the transmission channel 1, a signal on the connection terminal Xdcr is a high voltage signal even if the switch 7 is off. When this switch 7 is instead on, i.e., during the reception step of the transmission channel 1, the signal Xdcr is generally at a voltage value next to zero since the piezoelectric transducer connected to the transmission channel 1 is detecting small return echoes of ultrasound pulse signals, as shown in FIG. 2C.

Typically, in fact, an ultrasonic transducer transmits a high voltage pulse of the duration of a few us, and receives the echo of this pulse, generated by the reflection on the organs of a subject under examination, for the duration of about 250 us, and returns back to the transmission of a new high voltage pulse.

For example, a first pulse IM1 and a second pulse IM2 are transmitted with a peak to peak excursion equal, in the example shown, to 190 Vpp with reception by the transducer of corresponding echoes shown in FIG. 2C and indicated with E1 and E2.

In general the switch 7 should be a high voltage one so as not to break itself during the transmission step but it is in practice on always with low voltages during the receiving step.

BRIEF SUMMARY

One embodiment of the present disclosure is a switching circuit able to avoid undesired mitigations of a signal at its input during the receiving step, ensuring a correct working of a transmission channel that includes the switching circuit between a receiving mode and a transmission mode, in particular for ultrasound applications, and having such structural and functional features as to allow to overcome the limits and the drawbacks still affecting the circuits realized according to the prior art.

One embodiment of the present disclosure is a switching circuit that includes switching transistors as well as suitable bootstrap circuitry able to correctly drive the control terminals of such switching transistors with a correct "following" of a signal at the input of the same switching circuit towards its output.

One embodiment of the present disclosure is a switching circuit including first and second switching transistors, which are high voltage MOS transistors of complementary type, electrically coupled in series to each other between a connection terminal and an output terminal of a transmission channel and having respective equivalent or body diodes in anti-series. The switching circuit includes a bootstrap circuit connected to respective first and second control terminals of said first and second switching transistors, as well as to respective first and second voltage references. The bootstrap circuit includes a first parasitic capacitance electrically coupled between a first control terminal of the first switching transistor and a first bootstrap node and a second parasitic capacitance electrically coupled between a second control terminal of the second switching transistor and a second bootstrap node. The parasitic capacitances have capacitance values of at least one order of magnitude lower with respect to the gate-source capacitances of said first and second switching transistors.

More in particular, the disclosure comprises the following supplementary and optional characteristics, taken alone or in combination, if needed.

According to one embodiment of the present disclosure, the bootstrap circuit can comprise at least one first biasing generator electrically coupled between said first control terminal (XG1) and said first bootstrap node, as well as a second biasing generator electrically coupled between said second bootstrap node and said second control terminal as first and second parasitic capacitances of said bootstrap circuit.

According to one embodiment of the disclosure, said at least one first and second biasing generators can supply respective first and second biasing currents.

According to one embodiment of the disclosure, said bootstrap circuit can further comprise a first bootstrap transistor electrically coupled in series to a first bootstrap resistive element between said first control terminal of said first switching transistor and said second bootstrap node, as well as a second bootstrap transistor electrically coupled in series to a second bootstrap resistive element between said second control terminal of said second switching transistor and said first bootstrap node.

According to one embodiment of the disclosure, said first bootstrap transistor can have a control terminal connected to a first inner circuit node of said switching circuit, corresponding to a source terminal of said first switching transistor and said second bootstrap transistor can have a control terminal connected to a second inner circuit node of said switching circuit, corresponding to a source terminal of said second switching transistor.

Also according to one embodiment of the disclosure, said first bootstrap transistor can be a low voltage N-channel MOS transistor and said second bootstrap transistor can be a low voltage P-channel MOS transistor.

Furthermore, according to another aspect of the disclosure, said values of parasitic capacitances of said bootstrap circuit can be of at least some orders of magnitude, preferably three, lower with respect to the gate-source capacitances of said first and second switching transistors.

Moreover, also according to one embodiment of the disclosure, said first and second bootstrap nodes can be connected to said first and second voltage references, respectively.

One embodiment of the disclosure is a transmission channel that includes at least one switching circuit as above described and electrically coupled between a receiving mode and a transmission mode of a transmission channel for transferring, when on, a signal being at the output of an antinoise block of said transmission channel towards said output terminal.

The characteristics and the advantages of the switching circuit according to the disclosure will be apparent from the following description of an embodiment thereof given by way of indicative and non-limiting example with reference to the annexed drawings.

BRIEF DESCRIPTION OF THE SEVERAL VIEWS OF THE DRAWINGS

In these drawings:

FIG. 2C schematically shows a first and a second ultrasound pulse used in an ultrasonic transducer;

DETAILED DESCRIPTION

Figure 1:
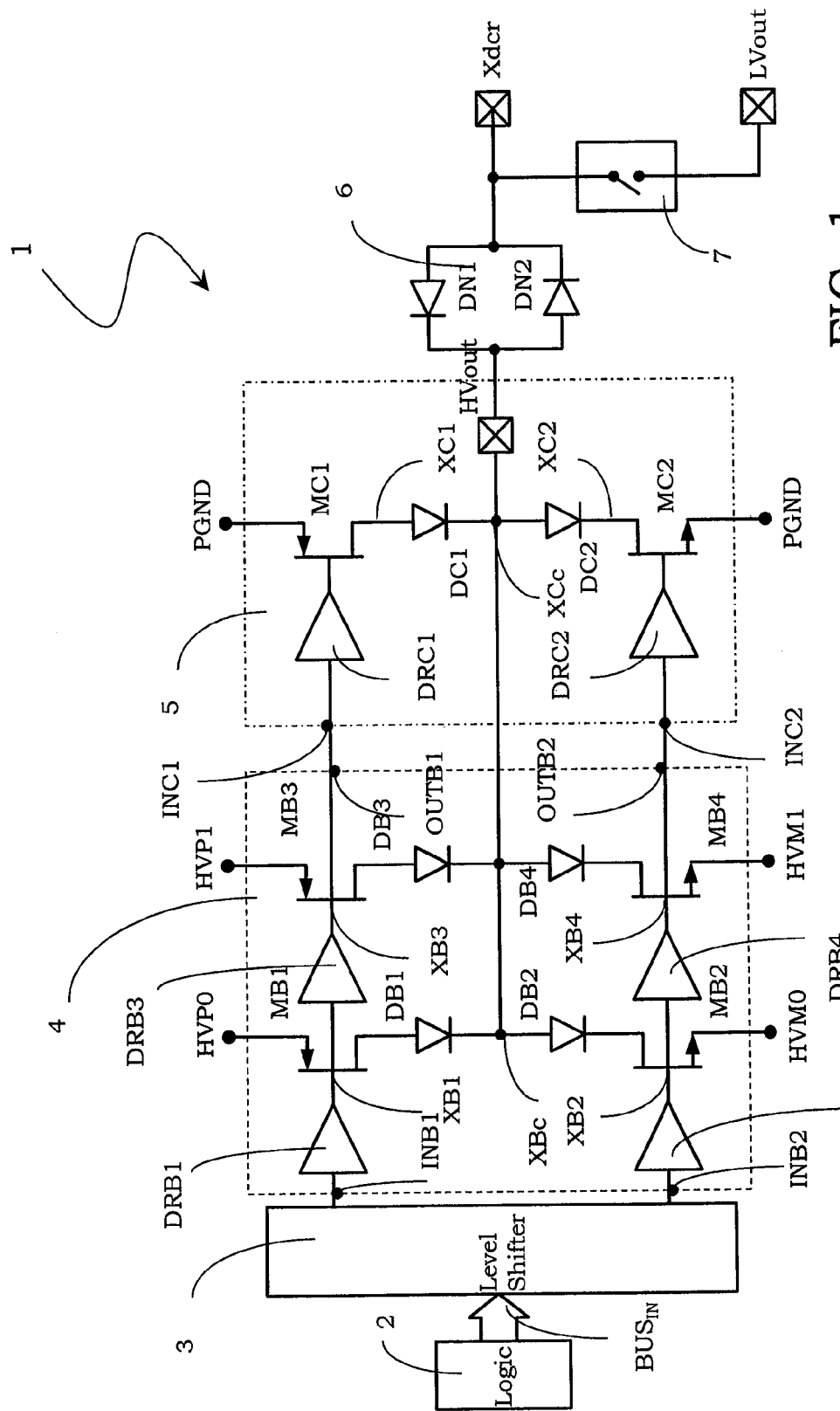
FIG. 1 schematically shows a transmission channel for ultrasound applications realized according to the prior art.
Figures 3A, 3B:
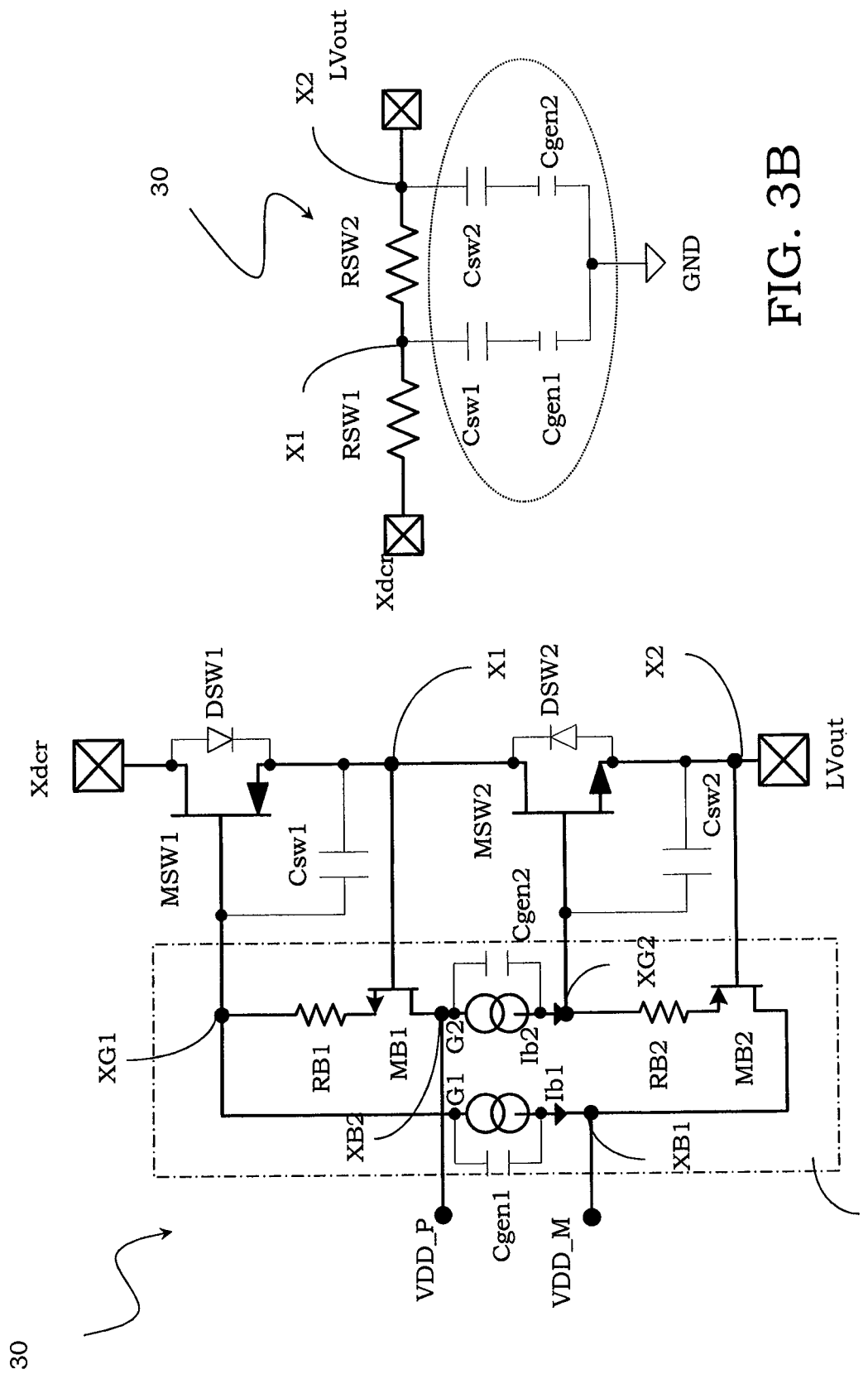
FIG. 3A shows in greater detail a switching circuit according to the disclosure, suitable for being used in a transmission channel for ultrasound applications.
FIG. 3B shows an equivalent circuit of the switching circuit of FIG. 3A according to the on conditions.

With reference to these figures, and in particular to FIG. 3A, a switching circuit 30 is described, in particular that can be used in the transmission channel 1 of FIG. 1 instead of the switching circuit 7, such as for ultrasound applications.

Figures 2A, 2B:
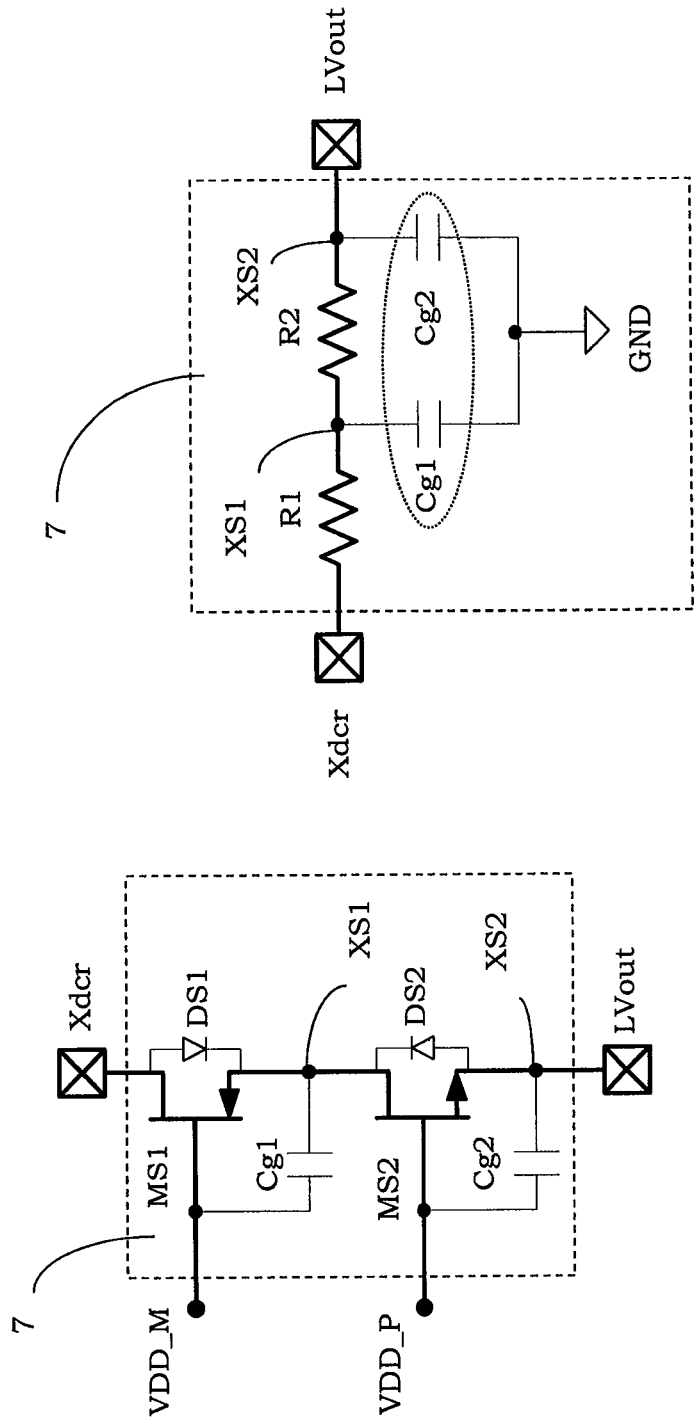
FIG. 2A shows in greater detail a high voltage switch during a turn-on step and being comprised in the transmission channel of FIG. 1.
FIG. 2B shows an equivalent circuit of the switch of FIG. 2A according to the on conditions.

Elements that structurally and functionally correspond to the high voltage switch 7 of the transmission channel described in relation to the prior art and shown in FIGS. 1 and 2A will be given the same alphanumeric references for simplicity of illustration.

The switching circuit 30 comprises at least one first switching transistor MSW1 and one second switching transistor MSW2 electrically coupled in series to each other between the connection terminal Xdcr and the output terminal LVout of a transmission channel 1 shown in FIG. 1 and described with reference to the prior art. In particular, the switching circuit 30 is suitable for being used as switching circuit between a receiving mode and a transmission mode of this transmission channel 1 and transfers, when on, a low voltage signal being at the output of an antinoise block of the transmission channel (as seen in relation to the prior art) towards the output terminal LVout.

In particular, in the example of FIG. 3A, the first switching transistor MSW1 is a high voltage P-channel MOS transistor (HV PMOS) while the second switching transistor MSW2 is a high voltage N-channel MOS transistor (HV NMOS). FIG. 3A also shows parasitic or body diodes of these transistors, respectively DSW1 and DSW2, connected in antiseries in correspondence with a first inner circuit node X1.

According to an embodiment of the disclosure, the switching circuit 30 comprises at least one bootstrap circuit 31 connected to a control or gate terminal XG1 of the first MSW1 switching transistor and to a control or gate terminal XG2 of the second switching transistor MSW2.

The bootstrap circuit 31 also include first second bootstrap nodes XB1, XB2 electrically coupled to a first and second voltage reference terminals VDD_M, VDD_P, respectively, in particular supply reference terminals.

According to an embodiment of the disclosure, the bootstrap circuit 31 comprises a first biasing generator G1 electrically coupled between the first control terminal XG1 and the first bootstrap node XB1, as well as a second biasing generator G2 electrically coupled between the second bootstrap node XB2 and the second control terminal XG2. These first and second biasing generators, G1 and G2, supply respective first and second biasing currents, Ib1 and Ib2 and have respective first and second parasitic capacitances, Cgen1 and Cgen2, that are the parasitic capacitances of said bootstrap circuit 31, respectively electrically coupled between the first control terminal XG1 and the first bootstrap node XB1 and between the second control terminal XG2 and the second bootstrap node XB2.

Further preferably, these first and second parasitic capacitances, Cgen1 and Cgen2, have a much lower capacitive value than respective first and second gate-source capacitances, Csw1 and Csw2, of the first and second switching transistors, MSW1 and MSW2. In particular, these first and second parasitic capacitances, Cgen1 and Cgen2, have a capacitive value of at least one order of magnitude, preferably some orders of magnitude, in particular three orders of magnitude, lower than the first and second gate-source capacitances, Csw1 and Csw2.

In particular, the first parasitic capacitance Cgen1 has capacitive value of at least one order of magnitude lower than the first gate-source capacitance Csw1 of the first switching transistor MSW1 and the second parasitic capacitance Cgen2 has capacitive value of at least one order of magnitude lower than the second gate-source capacitance Csw2 of the second switching transistor MSW2.

The bootstrap circuit 31 also comprises a first bootstrap transistor MB1 electrically coupled in series to a first bootstrap resistive element RB1, between the first control terminal XG1 of the first switching transistor MSW1 and the second bootstrap node XB2. The first bootstrap transistor MB1 also has a control terminal, or gate, connected to the first inner circuit node X1 of the switching circuit 30, corresponding to a source terminal of the first switching transistor MSW1.

Similarly, the bootstrap circuit 31 comprises a second bootstrap transistor MB2 electrically coupled in series to a second bootstrap resistive element RB2, between the second control terminal XG2 of the second switching transistor MSW2 and the first bootstrap node XB1. The second bootstrap transistor MB2 also has a control terminal, or gate, connected to a second inner circuit node X2 of the switching circuit 30, corresponding to a source terminal of the second switching transistor MSW2.

In particular, in the example of the figure, the first bootstrap transistor MB1 is a low voltage N-channel MOS transistor (LV NMOS) while the second bootstrap transistor MB2 is a low voltage P-channel MOS transistor (LV PMOS).

The first biasing generator G1 is a current generator suitable for supplying such a current Ib1 that the voltage developed by this current Ib1 flowing through the first bootstrap transistor MB1 and the first bootstrap resistive element RB1 is able to turn on the first switching transistor MSW1. The same way, the second biasing generator G2 is a current generator suitable for supplying such a current Ib2 that the voltage developed by this current Ib2 passing through the second bootstrap transistor MB2 and the second bootstrap resistive element RB2 is able to turn on the second switching transistor MSW2.

It is thus clear that, according to working or on conditions of the switching circuit 30, the same behaves like its equivalent circuit shown in FIG. 3B.

In particular, the gate terminals of the switching transistors MSW1 and MSW2 are both connected to a node fixed in voltage, schematized in the Figure as connected to the ground GND and these transistors behave as respective resistances RSW1 and RSW2, that are electrically coupled between the connection terminal Xdcr and the output terminal LVout of the transmission channel 1 (the output terminal LVout coinciding with the second inner circuit node X2) and interconnected in correspondence with the first inner circuit node X1.

According to these conditions, thanks to the presence of the bootstrap circuit 31 and of its biasing generators G1 and G2, the first gate-source capacitance Csw1 of the first switching transistor MSW1 is electrically coupled in series to the first parasitic capacitance Cgen1 of the first biasing generator G1 between the first inner circuit node X1 and the ground GND, while the second gate-source capacitance Csw2 of the second switching transistor MSW2 is electrically coupled in series to the second parasitic capacitance Cgen2 of the second biasing generator G2 between the second inner circuit node X2 and the ground GND.

In this way, the total parasitic capacitance (enclosed by a dotted circle in FIG. 3B) is reduced with respect to the known circuits, decreasing in consequence the undesired mitigation of the signal at the input of the same switching circuit 30, in particular applied to its connection terminal Xdcr and transmitted to its output terminal LVout.

In conclusion, the switching circuit according to the disclosure ensures a correct transmission of a signal applied thereto at the input, in particular on the connection terminal Xdcr, showing a reduced total parasitic capacitance according to the on conditions.

Obviously, a technician of the field, with the aim of meeting incidental and specific needs, will be allowed to introduce several modifications and variations to the above described circuit, all within the scope of protection of the disclosure.

Concurrently filed U.S. patent application Ser. Nos. 13/538,802, 13/538,821 and 13/538,840 and are incorporated herein by reference in their entireties, each of which claims priority to Italian Application Nos. MI09A002338, MI09A002339, MI09A002340 and MI09A002341, all filed on Dec. 30, 2009, and to International Application Nos. PCT/EP2010/005927, PCT/EP2010/005930, PCT/EP2010/005931 and PCT/EP2010/005932, all filed on Sep. 29, 2010). Aspects of the embodiments can be modified, if necessary to employ concepts of the various patents, application and publications to provide yet further embodiments.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A switching circuit, comprising:
   a connection terminal;
   an output terminal;
   first and second voltage reference terminals;
   first and second switching transistors electrically coupled in series to each other, and having respective body diodes coupled in anti-series, between said connection terminal and said output terminal, the first switching transistor having a first control terminal and the second switching transistor having a second control terminal;
   a bootstrap circuit connected to the first and second control terminals and to the first and second voltage references and including:
      first and second bootstrap nodes;
      a first parasitic capacitance electrically coupled directly between said first control gate terminal and the first bootstrap node; and
      a second parasitic capacitance electrically coupled directly between said second control gate terminal and the second bootstrap node, the first and second parasitic capacitances having capacitance values of at least one order of magnitude lower than gate-source capacitances of said first and second switching transistors.

2. A switching circuit according to claim 1, wherein the first control terminal is a gate of the first switching transistor and the second control terminal is a gate of the second switching transistor and said bootstrap circuit comprises:
   a first biasing generator electrically coupled directly between said first control terminal and said first bootstrap node; and
   a second biasing generator electrically coupled directly between said second bootstrap node and said second control terminal, the first and second biasing generators including the first and second parasitic capacitances, respectively.

3. A switching circuit according to claim 2, wherein said first and second biasing generators are configured to respectively supply first and second biasing currents.

4. A switching circuit, comprising:
   a connection terminal;
   an output terminal;
   first and second voltage reference terminals;
   first and second switching transistors electrically coupled in series to each other, and having respective body diodes coupled in anti-series, between said connection terminal and said output terminal, the first switching transistor having a first control terminal and the second switching transistor having a second control terminal;
   a bootstrap circuit connected to the first and second control terminals and to the first and second voltage references and including:
      first and second bootstrap nodes;
      a first parasitic capacitance electrically coupled between said first control terminal and the first bootstrap node; and
      a second parasitic capacitance electrically coupled between said second control terminal and the second bootstrap node, the first and second parasitic capacitances having capacitance values of at least one order of magnitude lower than gate-source capacitances of said first and second switching transistors, wherein said bootstrap circuit further comprises:
      a first bootstrap transistor and a first bootstrap resistive element electrically coupled in series to each other between said first control terminal and said second bootstrap node; and
      a second bootstrap transistor and a second bootstrap resistive element electrically coupled in series to each other between said second control terminal and said first bootstrap node.

5. A switching circuit according to claim 4, wherein said first bootstrap transistor has a control terminal electrically coupled to a source terminal of said first switching transistor and said second bootstrap transistor has a control terminal electrically coupled to a source terminal of said second switching transistor.

6. A switching circuit according to claim 4, wherein said first bootstrap transistor is a low voltage N-channel MOS transistor and said second bootstrap transistor is a low voltage P-channel MOS transistor.

7. A switching circuit according to claim 1, wherein said first and second bootstrap nodes are electrically coupled to said first and second voltage terminals, respectively.

8. A switching circuit according to claim 1, wherein said values of said parasitic capacitances of said bootstrap circuit are of at least three orders of magnitude lower with respect to the gate-source capacitances of said first and second switching transistors.

9. A switching circuit according to claim 1, wherein the first switching transistor is a high voltage PMOS transistor and the second switching transistor is a high voltage NMOS transistor.

10. A transmission channel comprising:
    a connection terminal;
    an output terminal; and
    a switching circuit having:
       first and second voltage reference terminals;
       first and second switching transistors electrically coupled in series to each other, and having respective body diodes coupled in anti-series, between said connection terminal and said output terminal, the first switching transistor having a first control gate and the second switching transistor having a second control gate;
       a bootstrap circuit connected to the first and second control gates and to the first and second voltage references and including:
          first and second bootstrap nodes;
          a first parasitic capacitance electrically coupled directly between said first control gate and the first bootstrap node; and
          a second parasitic capacitance electrically coupled directly between said second control gate and the second bootstrap node, the first and second parasitic capacitances having capacitance values of at least one order of magnitude lower than gate-source capacitances of said first and second switching transistors.

11. A transmission channel according to claim 10, further comprising:
    first and second high voltage reference terminals;
    a logic block configured to provide first and second control signals;
    a level shifter configured to convert the first and second control signals to first and second boosted control signals;
    a high voltage buffer block including first and second high voltage transistors coupled together between the first and second high voltage reference terminals and coupled to each other at a high voltage output terminal;
a clamping block coupled to the high voltage output terminal; and
an anti-noise block electrically coupled between the high voltage output terminal and the connection terminal.

12. A transmission channel according to claim 10, wherein said bootstrap circuit comprises:
a first biasing generator electrically coupled between said first control gate and said first bootstrap node; and
a second biasing generator electrically coupled between said second bootstrap node and said second control gate, the first and second biasing generators including the first and second parasitic capacitances, respectively.

13. A transmission channel according to claim 12, wherein said first and second biasing generators are configured to respectively supply first and second biasing currents.

14. A transmission channel comprising:
a connection terminal;
an output terminal; and
a switching circuit having;
first and second voltage reference terminals;
first and second switching transistors electrically coupled in series to each other, and having respective body diodes coupled in anti-series, between said connection terminal and said output terminal, the first switching transistor having a first control gate and the second switching transistor having a second control gate;
a bootstrap circuit connected to the first and second control gates and to the first and second voltage references and including:
first and second bootstrap nodes;
a first parasitic capacitance electrically coupled between said first control gate the first bootstrap node; and
a second parasitic capacitance electrically coupled between said second control gate and the second bootstrap node, the first and second parasitic capacitances having capacitance values of at least one order of magnitude lower than gate-source capacitances of said first and second switching transistors, wherein said bootstrap circuit further comprises:
a first bootstrap transistor and a first bootstrap resistive element electrically coupled in series to each other between said first control gate and said second bootstrap node; and
a second bootstrap transistor and a second bootstrap resistive element electrically coupled in series to each other between said second control gate and said first bootstrap node.

15. A transmission channel according to claim 14, wherein said first bootstrap transistor has a control terminal electrically coupled to a source terminal of said first switching transistor and said second bootstrap transistor has a control terminal electrically coupled to a source terminal of said second switching transistor.

16. A transmission channel according to claim 14, wherein said first bootstrap transistor is a low voltage N-channel MOS transistor and said second bootstrap transistor is a low voltage P-channel MOS transistor.

17. A transmission channel according to claim 10, wherein said first and second bootstrap nodes are connected to said first and second voltage terminals, respectively.

18. A transmission channel according to claim 10, wherein said values of said parasitic capacitances of said bootstrap circuit are of at least three orders of magnitude lower with respect to the gate-source capacitances of said first and second switching transistors.

19. A transmission channel according to claim 10, wherein the first switching transistor is a high voltage PMOS transistor and the second switching transistor is a high voltage NMOS transistor.

20. A method, comprising:
transmitting a high voltage signal from a high voltage input terminal to an input/output terminal while a switching circuit, electrically coupled between the input/output terminal and a low voltage output terminal, blocks the high voltage signal from the low voltage output terminal; and
receiving a low voltage signal at the input/output terminal; and
transmitting the low voltage signal through the switching circuit to said low voltage output terminal, wherein the switching circuit includes:
first and second voltage reference terminals;
first and second switching transistors electrically coupled in series to each other, and having respective body diodes coupled in anti-series between said input/output terminal and said low voltage output terminal, the first switching transistor having a first control gate and the second switching transistor having a second control gate;
a bootstrap circuit connected to the first and second control gates and to the first and second voltage references and including:
first and second bootstrap nodes;
a first parasitic capacitance electrically coupled directly between said first control gate and the first bootstrap node; and
a second parasitic capacitance electrically coupled directly between said second control gate and the second bootstrap node, the first and second parasitic capacitances having capacitance values of at least one order of magnitude lower than gate-source capacitances of said first and second switching transistors.

21. A method according to claim 20, comprising transmitting the high voltage signal to an ultrasonic transducer, wherein the receiving includes receiving the low voltage signal as an echo signal from the ultrasonic transducer.

* * * * *